(12) United States Patent
Thevenot et al.

(10) Patent No.: US 6,422,472 B1
(45) Date of Patent: Jul. 23, 2002

(54) MEMORY CARD OF THE CONTACTLESS TYPE

(75) Inventors: Benoît Thevenot, Olivet; Pascal Billebaud, Orleans, both of (FR)

(73) Assignee: Schlumberger Systems, Montrouge (FR)

( * ) Notice: Subject to any disclaimer, the term of this patent is extended or adjusted under 35 U.S.C. 154(b) by 0 days.

(21) Appl. No.: 09/297,635

(22) PCT Filed: Nov. 20, 1997

(86) PCT No.: PCT/FR97/02100

§ 371 (c)(1),
(2), (4) Date: May 5, 1999

(87) PCT Pub. No.: WO98/24057

PCT Pub. Date: Jun. 4, 1998

(30) Foreign Application Priority Data

Nov. 29, 1996 (FR) .............................. 96 14663

(51) Int. Cl.⁷ .......................... G06K 19/06; H01Q 1/36
(52) U.S. Cl. ...................... 235/492; 343/895; 343/886; 343/873
(58) Field of Search ........................ 235/492; 257/679; 343/895, 866, 700 MS, 873

(56) References Cited

U.S. PATENT DOCUMENTS

| | | | | |
|---|---|---|---|---|
| 4,864,383 A | * | 9/1989 | Gloton et al. ............... | 257/679 |
| 4,943,708 A | * | 7/1990 | Simmons et al. ............ | 235/492 |
| 4,962,415 A | * | 10/1990 | Yamamoto et al. ......... | 257/679 |
| 5,147,982 A | * | 9/1992 | Steffan ...................... | 174/52.2 |
| 5,184,209 A | * | 2/1993 | Kodai et al. ................ | 257/679 |
| 5,200,719 A | * | 4/1993 | Margulis et al. .............. | 333/34 |
| 5,519,524 A | * | 5/1996 | Fergason et al. ............ | 349/149 |
| 5,528,154 A | * | 6/1996 | Leichner et al. ............ | 324/693 |
| 5,585,617 A | * | 12/1996 | Ohbuchi et al. ............ | 235/491 |
| 5,598,032 A | | 1/1997 | Fidalgo ....................... | 257/679 |
| 5,705,852 A | | 1/1998 | Orihara et al. .............. | 257/679 |
| 5,710,458 A | * | 1/1998 | Iwasaki ....................... | 257/679 |
| 5,714,744 A | * | 2/1998 | Brice .......................... | 235/449 |
| 5,811,736 A | * | 9/1998 | Lauffer et al. .............. | 174/263 |
| 5,850,690 A | * | 12/1998 | Launay et al. ................ | 29/841 |
| 6,020,627 A | * | 2/2000 | Fries et al. .................. | 257/679 |
| 6,095,424 A | * | 8/2000 | Prancz ........................ | 235/492 |
| 6,109,530 A | * | 8/2000 | Larson et al. ............... | 235/492 |
| 6,353,420 B1 | * | 3/2002 | Chung ......................... | 235/441 |

FOREIGN PATENT DOCUMENTS

DE 4431605 3/1996
EP 0682321 11/1995

* cited by examiner

Primary Examiner—Michael G. Lee
Assistant Examiner—Jamara Franklin
(74) Attorney, Agent, or Firm—Birch, Stewart, Kolasch & Birch, LLP

(57) ABSTRACT

A contactless memory card that includes a card body (1), an integrated circuit (3) embedded in the card body, and a coupling antenna (4) connected to two contact pads (6) of the integrated circuit. The antenna is made in a spiral pattern, with its turns passing over the flush face (5) of the integrated circuit.

8 Claims, 1 Drawing Sheet

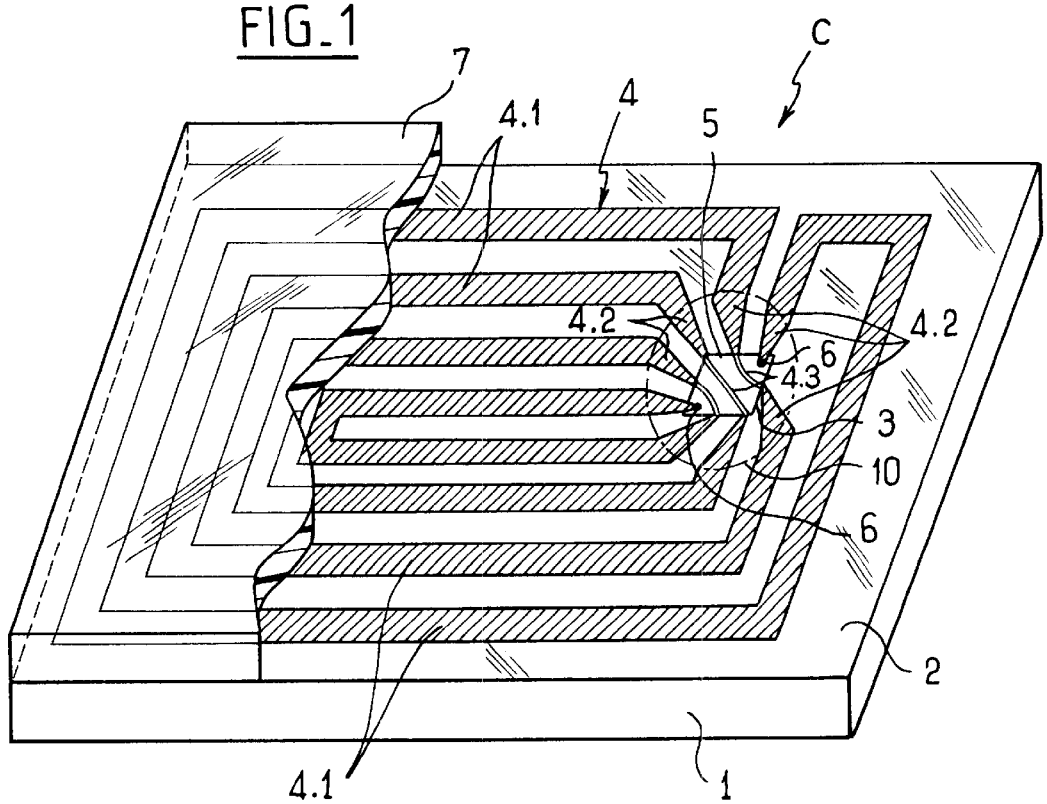
FIG_1
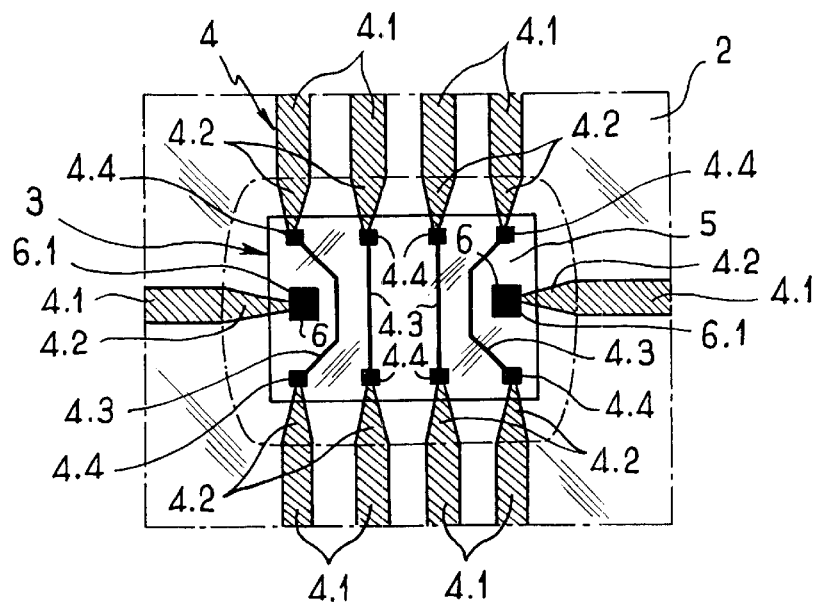
FIG_2

MEMORY CARD OF THE CONTACTLESS TYPE

The present invention relates to the field of memory cards of the contactless type. Such cards are commonly used, e.g. to constitute access badges or remote payment cards.

BACKGROUND OF THE INVENTION

Contactless memory cards generally comprise an integrated circuit and an associated coupling member, both embedded in a flat insulating assembly. The particular type of contactless memory card to which the invention applies is represented by cards having a card body of plastics material with an integrated circuit embedded in one face thereof, and with a coupling antenna on said face which is connected to two contact pads of the integrated circuit, and an insulating protective sheet covering said face of the card body.

In practice, the antenna is organized in a spiral pattern with the two ends of the spiral being connected to respective contact pads of the integrated circuit. The inner end of the spiral pattern can easily be connected to one of the two contact pads. However for the outer end it is necessary to provide a connection link which passes over the turns forming the antenna. That organization is made necessary by the need for the conductive track which forms the antenna to be as wide as possible, with the purpose of having a very wide track being associated with the need for resistance that is as low as possible so as to have an antenna with a Q factor that is as high as possible (where the Q or "quality" factor corresponds to the ratio of impedance over resistance). The technique of making antennas by using silkscreen printing to deposit a conductive paste is well known and well mastered. However, such pastes have high resistivity, thereby giving antennas whose (pure) resistance is high, reaching several tens of ohms. That is why more and more use is being made of antennas that are made of very wide silkscreen printed tracks, of maximum section, so as to reduce the resistance thereof. Obtaining a connection to the integrated circuit via conductive links situated at two superposed levels also requires manufacturers both to provide both a conductive bridge connecting the outer end of the antenna to one of the contact pads of the integrated circuit, and insulation disposed on the corresponding zone of the turns so that the conductive bridge can be placed over the insulation so as to avoid making contact with the turns over which it passes. Although silkscreen printing makes it possible to build up these various levels in succession at high rates of throughput, it nevertheless remains that three steps are required, and that the necessary accuracy is high, thereby further increasing manufacturing cost.

Document EP-A-0 737 935 discloses a contactless card having an internal layer carrying a spiral antenna and an integrated circuit placed across the turns of the antenna. The outer and inner ends of the antenna are connected to respective pads by means of an insulating layer extending between the turns and facing the integrated circuit, and made locally conductive in register with each of the pads.

Finally, reference can be made to document EP-A-0 671 705 which describes a dual-connection type card having a spiral antenna and an integrated circuit disposed over the turns of the antenna, which circuit is connected to the ends of the antenna via associated connection elements.

Cards made in accordance with either of the two above-specified documents are complex in structure, thereby giving rise to manufacturing costs that are high.

OBJECTS AND SUMMARY OF THE INVENTION

A particular object of the invention is to solve that problem, by designing a different organization enabling manufacture to be simplified and reducing production costs, without significant loss of Q factor compared with contactless cards of the above-mentioned type.

The invention thus seeks to provide a memory card whose structure makes it possible to minimize manufacturing steps, so as to have a manufacturing cost that is highly competitive while retaining a Q factor that is comparable to that of existing memory cards in which the antenna is made in three successive silkscreen printing steps.

According to the invention, this problem is solved by a memory card of the contactless type, comprising a card body of plastics material having an integrated circuit embedded in one face thereof, with a coupling antenna on said face being connected to two contact pads of the integrated circuit, and with an insulating protective sheet covering said face of the card body, wherein the antenna is organized as a spiral pattern whose turns pass over the flush face of the integrated circuit.

Such an organization for the antenna makes it possible to have a continuous profile passing over the flush face of the integrated circuit. The card made in this way is simple in structure so it is of relatively low cost to manufacture.

Advantageously, the antenna is constituted by a conductive track whose resistance is locally increased in a zone of the face of the card body directly surrounding the integrated circuit to connection with very narrow conductive lines organized on the flush face of the integrated circuit and passing between the two contact pads of said integrated circuit.

The narrowness of these lines makes them easier to implement on the flush face of the integrated circuit between the two contact pads. In addition, the local increase in resistance gives rise to only a limited increase in the resistance of the antenna, thus making it possible to conserve a high Q factor.

Preferably, the antenna-forming conductive track presents, in the above-specified zone, and for each of its turns, a width that is locally reduced, thereby locally increasing its resistance, and in particular a width that decreases progressively both for connection to the contact pads of the integrated circuit and for connection to the conductive lines passing between said contact pads. The locally narrowed width in a predetermined zone directly surrounding the integrated circuit serves specifically to connect with very narrow conductive lines. This zone is selected to be as small as possible so that the increase in resistance that results from the local reduction in section is as insignificant as possible compared with the resistance that would be offered by a traditional antenna of the same length.

In a particular embodiment, the width of the conductive track can be as great as 3 mm outside the above-specified zone, and can decrease to about 0.2 mm inside said zone close to the conductive lines organized on the flush face of the integrated circuit. The length of the segments of the conductive track having increased resistance constitutes no more than 10% of the total length of said conductive track.

The conductive track may be made completely out of conductive polymer deposited by silkscreen printing. In which case, a single manufacturing step suffices to make the entire antenna directly.

In a first variant, provision can be made for the flush face of the integrated circuit to present a pattern of conductive lines with connection lands at their ends, all of said lines and lands being made by metallization, and for the remaining portion of the conductive track to be made of conductive polymer deposited by silkscreen printing on the face of the card body. In which case, two successive manufacturing steps need to be implemented, but considerably lower resistivity is obtained because of the metallization, and the metallization step can be implemented on the silicon wafers themselves prior to being cut up to provide the integrated circuits. This makes it possible to metallize several tens of thousands of integrated circuits on a single occasion.

In another variant, it is possible to provide for the portion of the conductive track outside the above-mentioned zone to be made of metal deposited on the face of the card body, for the flush face of the integrated circuit to present a pattern of conductive lines with connection lands at their ends, all of said lines and lands being made by metallization, and for the remaining portion of the conductive track which is inside said above-mentioned zone to be made of conductive paste deposited by silkscreen printing on the face of the card body. In which case, even though it is necessary to implement three successive manufacturing steps, the accuracy required is much less than that with prior implementations, such that the machines used are of lower cost.

BRIEF DESCRIPTION OF THE DRAWINGS

Other characteristics and advantages of the invention will appear more clearly in the light of the following description and from the accompanying drawing relating to a particular embodiment, and in which:

FIG. 1 is a perspective view of a contactless card of the invention from which the major portion of the cover sheet has been removed to show more clearly how the coupling antenna is organized on the face of the card in which the integrated circuit is embedded; and FIG. 2 is a fragmentary plan view on a very large scale showing the integrated circuit zone in a variant in which the flush face of the integrated circuit has conductive lines made by metallization with the remaining portion of the antenna connected to these conductive lines being made all or in part by silkscreen printing on the face of the body of the card.

MORE DETAILED DESCRIPTION

In FIG. 1, there can be seen a memory card C of the contactless type comprising a card body 1 of plastics material having an integrated circuit 3 embedded in a face 2 thereof, and having on said face a coupling antenna 4 which is connected to two contact pads 6 of the integrated circuit 3, and an insulating protective sheet 7 covering said face of the card body. In conventional manner, the card body 1 and the cover sheet 7 are assembled together by hot rolling. The integrated circuit 3 is embedded in conventional manner in the body of the card 1 so that its top face with contact pads 6 (which face is referenced 5) is flush with the level of the face concerned 2 of the card body 1.

In accordance with the invention, the coupling antenna 4 is organized as a spiral pattern whose turns pass over the flush face 5 of the integrated circuit 3.

In addition, the antenna is advantageously constituted by a conductive track whose (pure) resistance is locally higher in a zone 10 (shown in chain-dotted line in FIG. 1) of the face 2 of the card body in the immediate vicinity of the integrated circuit 3 to where it is connected to the very narrow conductive lines which are organized on the flush face 5 of the integrated circuit and which pass between the two contact pads 6 of said integrated circuit.

The antenna-forming conductive track 4 is thus made up of segments referenced 4.1, which segments are of as great a width as possible (in practice, this width can be as much as 3 mm when depositing a conducive polymer by silkscreen printing). In the small zone 10, the illustrated conductive track is of locally-reduced width, thereby increasing its resistance, as represented in this case by segments 4.2, so that each of the turns of the conductive track is of a width that decreases progressively in said zone 10, with this applying both for the connections to the contact pads 6 of the integrated circuit 3 and to the connections with the conductive lines that pass between said contact pads. Finally, the antenna-forming spiral pattern 4 includes the abovementioned very narrow conductive lines referenced 4.3 which are organized on the flush face 5 of the integrated circuit 3. The segments of progressively decreasing width 4.2 are naturally organized to extend towards the terminal ends of the very narrow conductive lines 4.3 for connection thereto.

As mentioned above, the width of the conducive track can be as much as 3 mm outside the above-mentioned zone 10, and said width can drop to about 0.2 mm within said zone close to the conductive lines 4.3 organized on the flush face 5 of the integrated circuit 3.

Finally, only the segments 4.2 of progressively decreasing width and the segments 4.3 of very narrow width will increase locally the resistance of the conductive track forming the coupling antenna. Nevertheless, insofar as the zone 10 is small, the total length of the segments 4.2 and 4.3 in the conductive track represent only a small fraction of the total length of the conductive track. In practice, steps are taken to ensure that the total length of the higher resistance segments represents no more than 10% of the total length of the conductive track. It is then possible to envisage the conductive track passing or crossing several times over the flush face of the integrated circuit, using very narrow conductive lines each of a width that may be about 0.2 mm, for example, and with the lines being spaced apart by about 0.15 mm. In FIG. 1, a conductive track is shown organized to have three such crossings, but naturally this number could be different, and in particular it could be larger.

The conductive track 4 can be made entirely out of conductive polymer that is deposited by silkscreen printing. In which case, the manufacturing process has a single silkscreen printing step, with the conductive track being deposited simultaneously on the corresponding face of the card body and on the flush face of the integrated circuit which is embedded in said card body. This enables manufacture to be considerably simplified, so the resulting production costs are extremely competitive.

In another variant, it is possible to provide for the conductive track to be made in two or three separate steps, one of which relates to forming conductive lines on the flush face of the integrated circuit by a metallization technique.

Such a variant will be better understood with reference to FIG. 2 which shows an integrated circuit 3 whose flush face 5 has a pattern of conductive lines 4.3 with connection lands 4.4 at their ends, the entire pattern being made by metallization. The presence of contact lands referenced 6.1 will also be observed at the two contact pads 6 of the integrated circuit 3, these two lands likewise being made by metallization. This manufacturing step is preferably performed prior to the integrated circuit being embedded in the card body, and in particular it is preferably performed directly on the silicon wafer before it is cut up to form the individual integrated circuits. It is then possible in a single operation to metallize tens of thousands of integrated circuits. Under such circumstances, the printed circuits that are embedded already have the desired pattern of conductive lines 4.3 and of the associated connection lands 4.4 and 6.1. It then suffices to make the remaining portion of the conductive track, e.g. by making said remaining portion out of conductive polymer which is deposited by silkscreen printing on the face 2 of the card body, with connection being via segments of locally reduced width 4.2 extending the ends of the silk-screen printed pattern to the connection lands already presents on the flush face of the integrated circuit.

Although this manufacturing process does indeed require two separate steps, this solution remains highly advantageous insofar as the desired pattern of conductive lines can be made with a very high degree of definition, together with the associated connection lands on the flush face of the integrated circuit, with this metallization operation preferably being performed on the complete silicon wafer before it is cut up. It is then easy to obtain not only low resistivity, but also widths of the above-mentioned order, with 0.2 mm for the very narrow width of the conductive lines 4.3 and with intermediate spaces of 0.15 mm.

In another variant, while still using metallization as described to make the conductive lines and the connection lands on the flush face of the integrated circuit, it is possible to make the portion 4.1 of the conductive track 4 (not included in the zone 10) out of metal, and in particular out of copper, which is deposited on the face of the card body, e.g. by a technique that is conventionally used for making printed circuits, and to make the remaining portion 4.2 (i.e. the portion within the zone 10) out of a conductive paste deposited by silkscreen printing on the face of the card body.

Although manufacture then appears to be more complicated because there are three separate manufacturing steps, this variant is advantageous insofar as using a metal makes it possible to implement segments 4.1 that are narrower than it is possible with a conductive polymer, and insofar as using a conductive paste makes it easy to provide the desired local electrical connection without needing to take excessive precautions concerning the increase in the resistance of the segments concerned 4.2. In addition, the accuracy required under such circumstances is much less than that required for the preceding implementations, thus making it possible to use machines that are less sophisticated and that have higher throughputs, thus making the card less expensive to manufacture.

Calculation has been performed to compare the resistance of a traditional spiral-wound antenna having a length of 80 cm with the resistance of an antenna of the same length but with its resistance being locally increased in accordance with the invention, the total length of the higher resistance segments amounting to about 5 cm. The calculations tend to show that the resistances of the antennas are practically the same in both cases, such that, in particular, the short distance of reduced section does not in practice significantly disturb the long length of the antenna.

Such an organization for the antenna makes it possible to have a Q factor that is highly satisfactory, while enabling manufacture to be simplified and/or obtained at a high throughput.

The invention is not limited to the embodiment described above, but on the contrary covers any variant using equivalent means to reproduce the essential characteristics specified above.

What is claimed is:

1. A memory card (C) comprising a card body (1) of plastics material having an integrated circuit (3) embedded in one face (2) thereof, with a coupling antenna (4) on said face being connected to two contact pads (6) of the integrated circuit (3), and organized as a spiral pattern, wherein turns of the spiral pattern pass over a flush face (5) of the integrated circuit (3), and an insulating protective sheet (7) covering said face of the card body, wherein the antenna (4) is constituted by a conductive track, wherein a width of the conductive track is locally decreased in a zone (10) of the face (2) of the card body directly surrounding the integrated circuit (3) to connection with conductive lines (4.3) that are narrow compared with the conductive track outside said zone and organized on the flush face (5) of the integrated circuit (3) and passing between the two contact pads (6) of said integrated circuit.

2. A memory card according to claim 1, wherein an antenna-forming conductive track (4) presents, in above-specified zone (10), and for each of the turns, a width that decreases progressively for connection to the conductive lines (4.3) passing between the contact pads (6) of the integrated circuit (3).

3. A memory card according to claim 1, wherein an antenna-forming conductive track (4) presents, in above-specified zone (10), a width that decreases progressively for connection to the contact pads (6) of the integrated circuit (3).

4. A memory card according to claim 2, wherein the width of the conductive track can be as great as 3 mm outside the above-specified zone (10), and decreases to about 0.2 mm inside said zone close to the conductive lines (4.3) organized on the flush face (5) of the integrated circuit (3).

5. A memory card according to claim 2, wherein a length of segments (4.2, 4.3) of the conductive track (4) having decreased width constitutes no more than 10% of a total length of said conductive track.

6. A memory card according to claim 2, wherein the conductive track (4) is made completely of conductive polymer deposited by silk-screen printing.

7. A memory card according to claim 2, wherein the flush face (5) of the integrated circuit (3) presents a pattern of conductive lines (4.3) with connection lands (4.4) at ends of the conductive lines, all of said lines and lands being made by metallization, and wherein remaining portion (4.1, 4.2) of the conductive track (4) is made of conductive polymer deposited by silkscreen printing on the face (2) of the card body.

8. A memory card according to claim 2, wherein portion (4.1) of the conductive track (4) outside the above-specified zone (10) is made of metal deposited on the face (2) of the card body, wherein the flush face (5) of the integrated circuit (3) presents a pattern of conductive lines (4.3) with connection lands (4.4) at ends of the conductive lines, all of said lines and lands being made by metallization, and wherein remaining portion (4.2) of the conductive track (4) which is inside said above-specified zone (10) is made of conductive paste deposited by silkscreen printing on the face (2) of the card body.

* * * * *